United States Patent
Micheloni et al.

(10) Patent No.: US 6,301,149 B1
(45) Date of Patent: Oct. 9, 2001

(54) METHOD FOR READING A MULTILEVEL NONVOLATILE MEMORY AND MULTILEVEL NONVOLATILE MEMORY

(75) Inventors: Rino Micheloni, Turate; Giovanni Campardo, Bergamo, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/513,598

(22) Filed: Feb. 25, 2000

(30) Foreign Application Priority Data

Feb. 26, 1999 (EP) .................................................. 99830108

(51) Int. Cl.[7] .................................................. G11C 11/56
(52) U.S. Cl. ............... 365/168; 365/185.03; 365/185.19; 365/185.21
(58) Field of Search ............... 365/168, 185.03, 365/185.19, 185.21

(56) References Cited

U.S. PATENT DOCUMENTS

| 5,218,569 | 6/1993 | Banks .............................. 365/189.01 |
| 5,394,362 | 2/1995 | Banks .............................. 365/189.01 |
| 5,487,045 | 1/1996 | Trodden .............................. 365/205 |
| 5,729,490 | * 3/1998 | Calligaro et al. ............... 365/185.03 |
| 5,757,719 | * 5/1998 | Calligaro et al. .................... 365/235 |
| 5,764,571 | 6/1998 | Banks .............................. 365/189.01 |
| 5,886,546 | * 3/1999 | Hwang .............................. 327/103 |
| 6,097,635 | * 8/2000 | Chang .............................. 365/185.21 |
| 6,118,701 | * 9/2000 | Calligaro et al. ................. 365/185.2 |

OTHER PUBLICATIONS

Gastaldi, R. et al., "A 1–Mbit CMOS EPROM with Enhanced Verification," *I.E.E.E. Journal of Solid–State Circuits*, 23(5):1150–1156, Oct. 1988.

* cited by examiner

*Primary Examiner*—David Nelms
*Assistant Examiner*—Connie C. Yoha
(74) *Attorney, Agent, or Firm*—Theodore E. Galanthay; Robert Iannucci; Seed IP Law Group, PLLC

(57) ABSTRACT

The sensing circuits comparing the current flowing in the cell with a plurality of reference currents are not identical to each other but differently amplify the compared currents. In particular, the sensing circuit associated with the lowest reference current amplifies the cell current more than the other sensing circuits and to the respective reference current. The current dynamics is thereby increased and it is possible to keep the reading voltage low, since the inherent characteristic of the lowest reference current may be very close to or directly superimposed on that of the immediately preceding memory cell current distribution, retaining the possibility of discriminating between the different logic levels.

18 Claims, 4 Drawing Sheets

METHOD FOR READING A MULTILEVEL NONVOLATILE MEMORY AND MULTILEVEL NONVOLATILE MEMORY

TECHNICAL FIELD

The present invention relates to a method for reading a multilevel nonvolatile memory and a multilevel nonvolatile memory, particularly a flash memory.

BACKGROUND OF THE INVENTION

As known, the need of nonvolatile memories with ever larger densities leads to the design of multilevel memories wherein the data, stored in the floating gate regions of the cells, are coded on several logic levels, dividing up the quantity of charge stored in each cell.

FIG. 1 shows the characteristic linking the gate-source voltage $V_{gs}$ to the drain-source current $I_{ds}$ of a flash cell for a two level memory, i.e., wherein data are coded in each cell of the memory by a bit having two possible values, associated respectively with an on or off condition of the cell, in its turn depending on the programmed or not state of the cell. In particular, in FIG. 1 $V_{tv}$ and $V_{tw}$ represent the value of the gate-source voltage $V_{gs}$ at which a flash cell begins to conduct current, for virgin (erased) cell and written cell respectively. In a memory of this type, generally the characteristic having threshold voltage $V_{tv}$, normally between 1 and 2.5 V, is assigned to the logic value "1", and the characteristic having threshold voltage $V_{tw}$, generally greater than 5 V, is assigned to the logic value "0".

It is also known that reading a memory cell consists in converting the current absorbed by the memory cell, at a given gate-source voltage $V_{gs}$, into a voltage then translated to a CMOS output level by a suitable comparator circuit. An example of a known reading circuit is shown in FIG. 2; the reading circuit 1 comprises a current/voltage converter (formed by a current mirror circuit 2) and a comparator 3; the current mirror circuit 2 has two nodes respectively connected to a memory cell 4 and to a reference cell 5 and to the inputs of the comparator 3, the output of which supplies the CMOS level signal coding the bit read.

In case of multilevel cells, the plane ($V_{gs}$, $I_{ds}$) is subdivided by several characteristics, as shown in FIG. 3 for example, relating to the storage of two bits per cell, corresponding to four logic values "11","10", "01" and "00". Here the four logic values correspond to four different threshold values Vt1, Vt2, Vt3 and Vt4, in their turn linked to different quantities of charge stored in the floating gate region of the memory cells.

Cell programming is affected by uncertainty and the characteristics of both FIG. 1 and FIG. 3 represent the central value of the distributions that can actually be obtained; in practice, each threshold value is associated to a respective distribution of values comprised between a minimum and a maximum value sufficiently spaced from the maximum value of the preceding distribution and/or from the minimum value of the subsequent distribution to enable the cell to be correctly read. Furthermore, each distribution may exhibit a different amplitude, as shown in FIG. 4 for example, showing the distributions associated with memory cells each storing two bits and in which the scale is not uniform.

In this case also, reading consists of converting the current flowing in the cell into a voltage; the voltage thus obtained is then compared with various voltage values intermediate between the threshold distributions discussed above.

One of the problems arising in case of multilevel cell reading is linked to the reading voltage applied to the gate terminals of the cells to be read; at the selected reading voltage, all the read cells (possibly except the cells programmed at the highest threshold value) must be on, to be able to compare the converted voltage with the different voltage levels; consequently, the reading voltage must be at least greater than the penultimate threshold value ($V_{t3}$ in FIG. 3; $V_R$ in FIG. 4, equal to 6 V here).

FIG. 5 shows the variability intervals of the characteristics, taking account of the distributions of the threshold voltages shown in FIG. 4 and three reference current values $I_{R1}$, $I_{R2}$, $I_{R3}$ compared with the current flowing in the memory cells at the reading voltage $V_R$. In practice, the three reference current values have an intermediate value between the various distributions of characteristics.

According to an embodiment, at the reading voltage $V_R$ of 6 V, the distribution of currents associated with the logic level "11" varies between 70 and 85 μA, the distribution of currents associated with the logic level "10" varies between 40 and 50 μA, the distribution of currents associated with the logic level "01" varies between 10 and 20 μA, and the cells storing the logic level "00" are off. The reference currents $I_{R1}$, $I_{R2}$, $I_{R3}$ are therefore equal to 60, 30 and 5 μA respectively.

FIG. 6 shows an example of a reading logic circuit 10 generating two bits O1, O2 stored in a cell, after comparison with three reference voltages $V_1$, $V_2$, $V_3$ corresponding to the reference current values $I_{R1}$, $I_{R2}$, $I_{R3}$ of FIG. 5, wherein $V_1 < V_2 < V_3$. In detail, the reading logic circuit 10 comprises three comparators 11, 12, 13, receiving, at the noninverting inputs, a same voltage $V_m$ resulting from the conversion of the current flowing in a read memory cell and, at the inverting inputs, a respective reference voltage $V_1$, $V_2$, $V_3$. The output of the comparator 11 is connected to a first input of a first AND gate 14 with three inputs; the output of the comparator 12 defines a first output 15 of the reading logic circuit 10 and is connected to a second input of the first AND gate 14 through a first inverter 16; the output of the comparator 13 is connected to a third input of the first AND gate 14 and to an input of a second AND gate 17 with two inputs. The output of the first AND gate 14 is connected to a second input of the second AND gate 17 through a second inverter 18. In this way, the output 15 of the reading logic circuit 10 supplies the first bit O1; the output of the second AND gate 17 defines a second output 19 of the reading logic circuit 10 and supplies the second bit O2.

The memory cells of the type under consideration have small gain (20 μA/V); furthermore, existing architectures require that the reading voltage $V_R$ (the minimum value of which is limited by the distributions of the threshold voltages, as explained above) be not too high (no greater than 6 V for example). These conditions present a problem when reading cells storing four levels (two bits); in fact, it is necessary to discriminate between currents different from each other by 10 μA but having different common mode contributions, given that the difference between the various currents is always selected to be equal to 10 μA, but the absolute value varies between 0 and 70 μA. Discrimination is also rendered more complex by the variations in gain associated with the different threshold voltages.

SUMMARY OF THE INVENTION

An embodiment of the invention provides a reading method and a memory that overcome the disadvantages of the known solutions, enabling multilevel cells to be read quickly and reliably.

The method includes the steps of supplying first currents, correlated to a cell current flowing in a memory cell to be read, and second currents, correlated to reference currents, to a plurality of comparison circuits and comparing said first currents with a respective one of said second currents, wherein said step of supplying comprises the step of differently amplifying at least one of said cell current and said reference currents.

The memory includes a multilevel memory cell that supplies a cell current and a first reference cell that supplies a first reference current. A first current amplifier is coupled to the first reference cell and is structured to amplify the first reference current to create a first intermediate current. A first comparator circuit is coupled to the memory cell and the first current amplifier and is structured to compare the cell current with the first intermediate current.

BRIEF DESCRIPTION OF THE DRAWINGS

For an understanding of the invention a preferred embodiment will now be described, purely by way of non-limiting example, with reference to the accompanying drawings wherein.

DETAILED DESCRIPTION OF THE DRAWINGS

According to an embodiment of the invention, the sensing circuits necessary for each memory cell to be read (equal to the number of logic values that can be stored in a memory cell minus one) are not identical to each other but amplify the compared currents (cell current, equal to the current flowing in a memory cell to be read, and reference current, equal to the current flowing in a respective memory cell) in a different manner. In particular, according to a first solution, the sensing circuits associated with higher reference currents directly compare the currents flowing in the memory cell and in the reference cells; in contrast, the sensing circuit or circuits associated with the lowest reference current or currents compare amplified values of the current flowing in the memory cell and in the reference cells. According to another solution the sensing circuit or circuits associated with the lowest reference current or currents differently amplify the cell current and the reference current. According to a third solution, all the sensing circuits amplify both the cell current and the reference current but the amplification factor in each sensing circuit is different, in particular it is such as to increment more the dynamics of the intrinsically lowest currents. Optionally, also here, the amplification of the cell current may be different from that of the reference current; this allows, for example, to set the intrinsic characteristic of the reference cell with lowest current very close to or directly superimposed oh the current distribution of the immediately preceding memory cells, retaining the possibility of discriminating between the different logic levels.

An embodiment is described below relative to different amplification factors in the different sensing circuits, with reference cell characteristic associated with the minimum reference current $I_{R3}$ equal to the extreme threshold of the distribution associated with the logic level "01". In particular, in this embodiment, the sensing circuits associated with reference currents $I_{R1}$ and $I_{R2}$ multiply both the cell current and the respective reference current by two while the sensing circuit associated with reference current $I_{R3}$ multiplies the cell current by three and the reference current by two.

Figure 1:
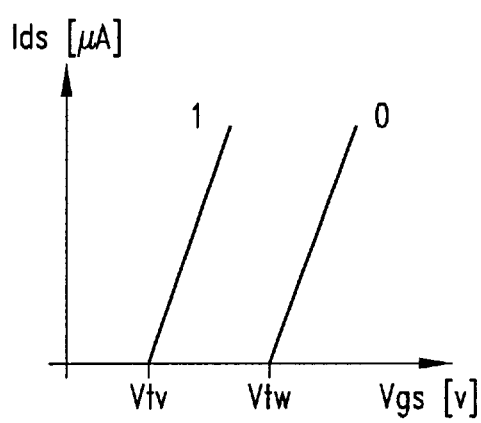
FIG. 1 shows the current-voltage characteristics used for storing one bit per cell of a memory.
Figure 2:
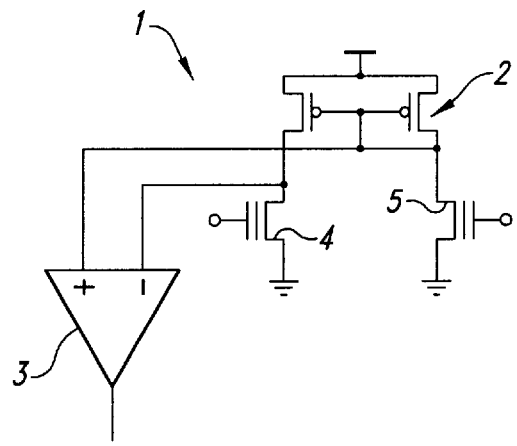
FIG. 2 shows a known reading device for one bit cells.
Figure 3:
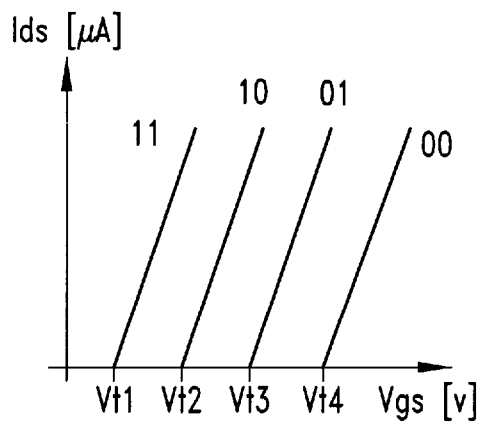
FIG. 3 shows the current-voltage characteristics used for storing two bits per cell of a memory.
Figure 4:
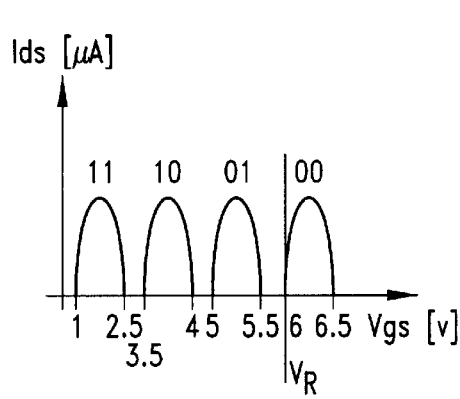
FIG. 4 shows the distribution of the actual threshold voltages when storing two bits per cell.
Figure 5:
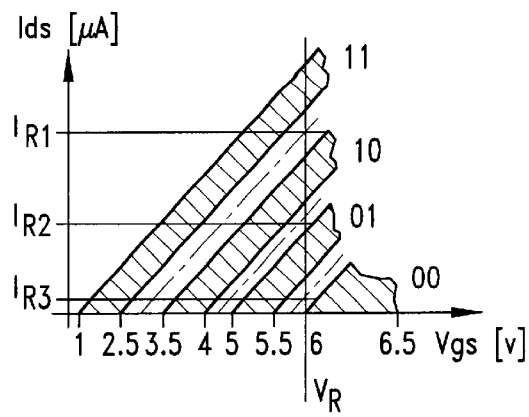
FIG. 5 shows the distribution of the characteristics when storing of two bits per cell.
Figure 6:
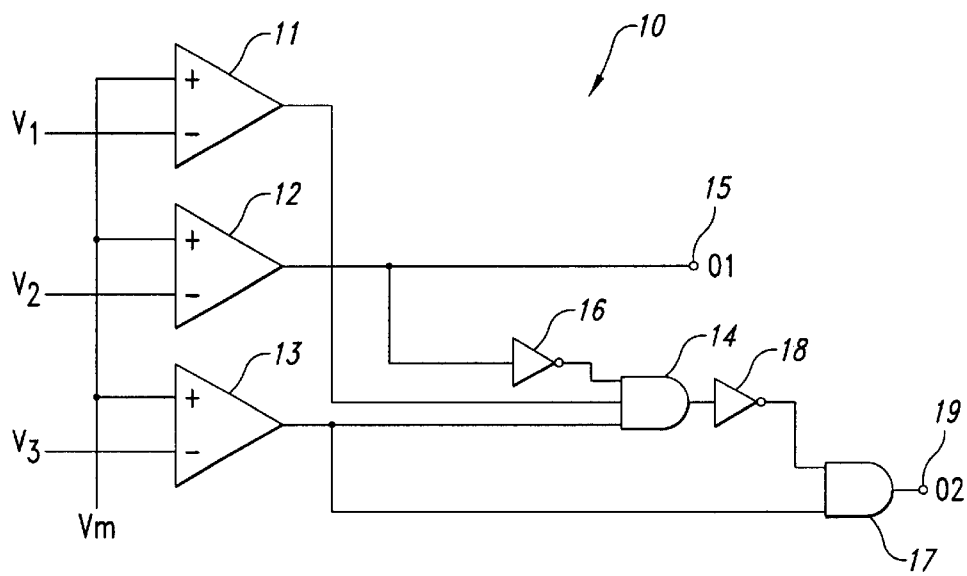
FIG. 6 shows a logic circuit belonging to the reading device, outputting the two bits stored in four level cells.
Figure 7:
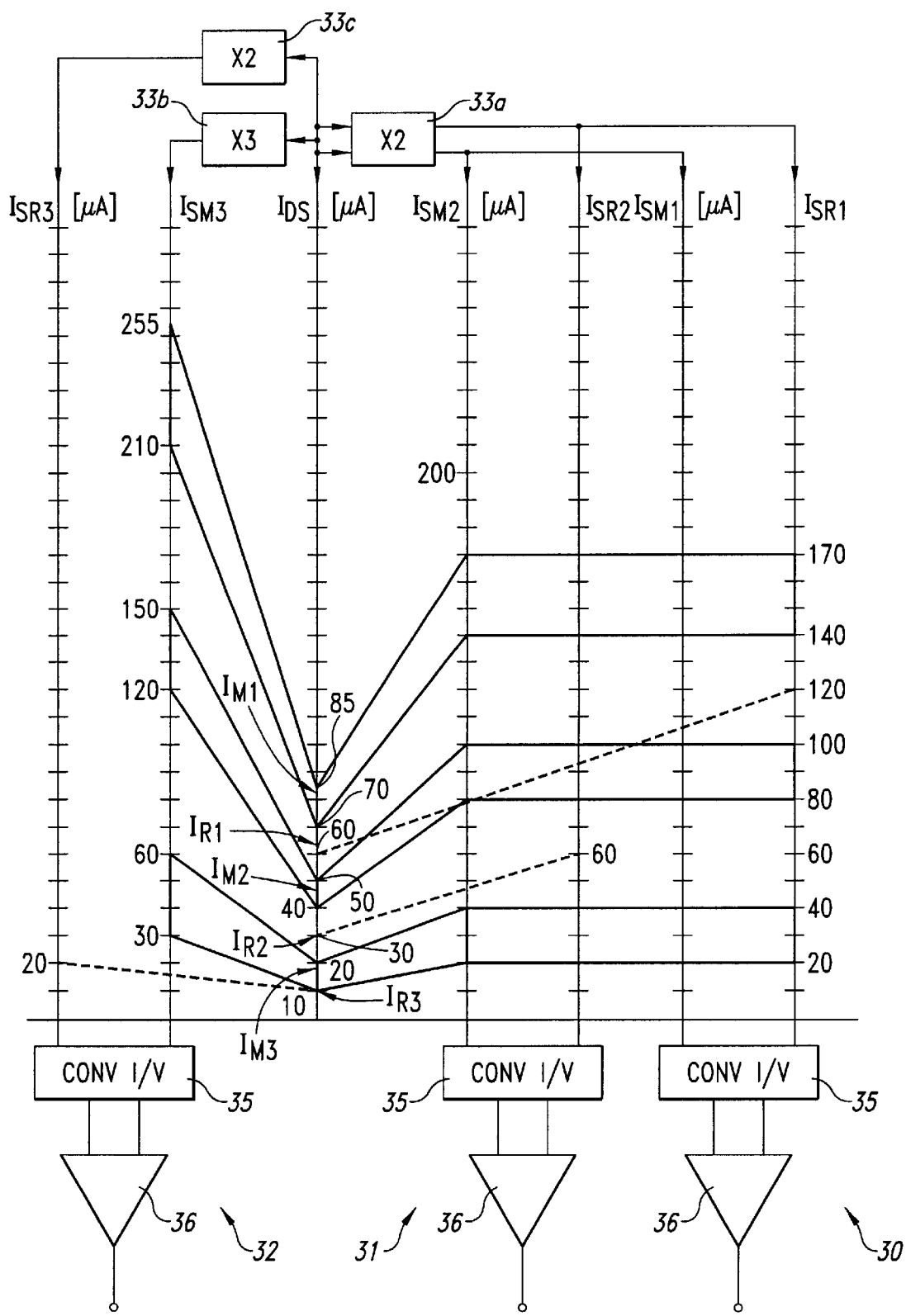
FIG. 7 shows a graph which diagrammatically illustrates an embodiment of the method according to the invention.

FIG. 7 shows a diagram of a possible implementation of this solution. In particular FIG. 7 shows seven vertical axes plotting the current values $I_{DS}$, $I_{SM1}$ and $I_{SR1}$, $I_{SM2}$, $I_{SR2}$, $I_{SM3}$, $I_{SR3}$ discussed below, wherein each mark represents an increment of 10 $\mu$A; FIG. 7 also shows schematically three sensing circuits 30, 31, 32. The sensing circuits 30–32 comprise current multiplier elements, 33a, 33b and 33c, respective current/voltage converters 35 and respective comparators 36. In particular, in the diagrammatic representation of FIG. 7, the current multiplier element 33a is common to the sensing circuits 30 and 31 while the current multiplier elements 33a and 33c form part of the sensing circuit 32.

The central axis $I_{DS}$ plots the distributions of current corresponding to logic levels 11, 10 and 01 in case of array cells biased at the reading voltage $V_R$ =6 V (currents $I_{M1}$, $I_{M2}$, $I_{M3}$) and the currents supplied by three reference cells R1, R2, R3 (not shown in FIG. 7) biased at the same reading voltage $V_R$ (currents $I_{R1}$, $I_{R2}$, $I_{R3}$).

The two axes on the far right, denoted by $I_{SM1}$ and $I_{SR1}$, plot the currents compared in the first sensing circuit 30 after multiplication by 2 in the current multiplier element 33a. Currents $I_{SM1}$ and $I_{SR1}$ are obtained by multiplying by 2 both the current $I_{DS}$ of the array cell read at that moment (which may have any one of the three distributions $I_{M1}$, $I_{M2}$, $I_{M3}$) and the current $I_{R1}$ of the reference cell R1. A doubling of the available current dynamics is obtained in this way.

Axes $I_{SM2}$ and $I_{SR2}$ plot the currents compared in the second sensing circuit 31 after having also been multiplied by 2 in the current multiplier element 33a. In a manner similar to the first sensing circuit 30, the currents $I_{SM2}$ and $I_{SR2}$ are obtained by multiplying by 2 both the current $I_{DS}$ of the array cell read then and the current $I_{R2}$ of the reference cell R2, obtaining a doubling of the available current dynamics in this case also.

The two axes on the far left, denoted by $I_{SM3}$ and $I_{SR3}$, plot the currents compared in the third sensing circuit 32 after having been multiplied by 3 and 2 respectively in the current multiplier elements 33b and 33c. Current $I_{SM3}$ is obtained by multiplying the current $I_{DS}$ of the array cell read at that moment by 3 while current $I_{SR3}$ is obtained by multiplying current $I_{R3}$ of the reference cell R3 by 2. This solution, therefore, provides not only an increase in dynamics but also the differentiation of the currents supplied to the I/V converter 36 of the third sensing circuit 32 including when the cell has a threshold voltage equal to the lower limit (in FIG. 7) of the distribution corresponding to logic level "01".

Figure 8:
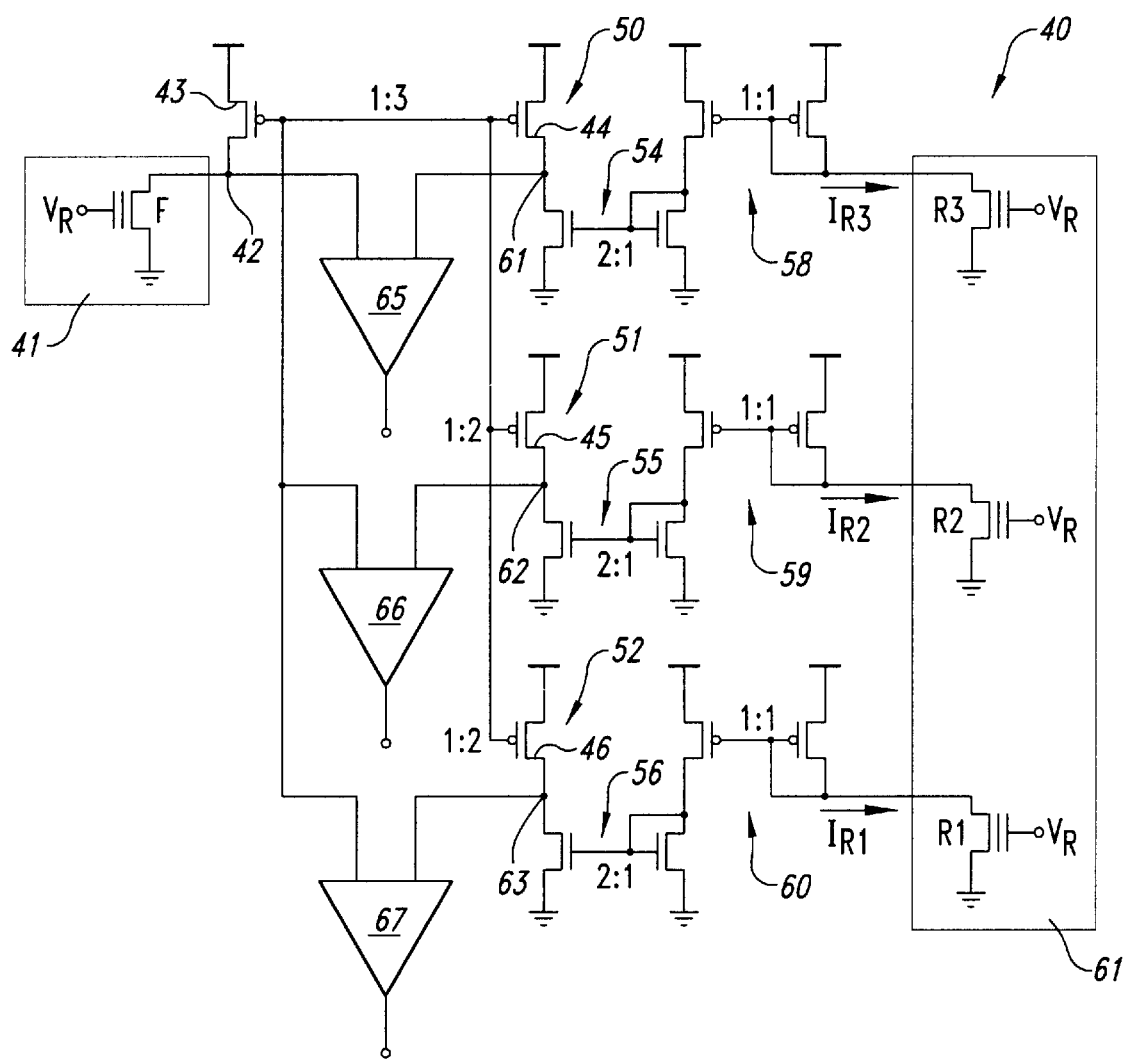
FIG. 8 shows the equivalent electric diagram of a part of the memory according to the invention.

FIG. 8 shows a circuitry embodiment of the diagram of FIG. 7. In detail, a memory 40 comprises a cell array 41 wherein a memory cell F of flash EEPROM type is addressed to be read. Memory cell F therefore has a source terminal connected to ground, a gate terminal biased at voltage $V_R$ and a drain terminal connected, by selection and bias circuits not shown, to a first intermediate node 42 and to the drain terminal of a PMOS transistor 43 diode-connected. The PMOS transistor 43 has a gate terminal connected to the gate terminals of three other PMOS transistors 44, 45 and 46 with which it forms three first PMOS current mirrors 50, 51 and 52 of 1:3, 1:2 and 1:2 type, respectively.

The PMOS transistors 44, 45 and 46 are connected to three respective reference cells R3, R2, R1 by respective NMOS current mirrors 54, 55 and 56 and respective second PMOS current mirrors 58, 59 and 60. In detail, the reference cells R3, R2 and R1 are arranged in a small array 61 and are written so that each supplies, at the reading voltage $V_R$, the respective reference current $I_{R3}$, $I_{R2}$ and $I_{R1}$. The drain terminals of the reference cells R3, R2 and R1 are connected to a diode-connected PMOS transistor of the respective second PMOS current mirrors 58, 59 and 60. The second PMOS current mirrors 58, 59 and 60 are 1:1 mirrors, which exactly carry the currents of the respective reference cell R3, R2 and R1 to the NMOS current mirrors 54, 55 and 56. In turn the NMOS current mirrors 54, 55 and 56 are 1:2 current mirrors that amplify the respective reference current $I_{R3}$, $I_{R2}$, and $I_{R1}$ by two, forcing a current equal to twice the respective reference current in a respective intermediate node 61, 62 and 63 (which connects them to transistors 44, 45 and 46).

The second intermediate nodes 61, 62 and 63 are each connected to a first input of a respective comparator 65, 66 and 67, the second inputs of which are all connected to the first intermediate node 42.

In practice, in FIG. 8, the mirrors 50, 54 form the sensing circuit 32 of FIG. 7, the mirrors 51, 55 form the sensing circuit 31 and the mirrors 52, 56 form the sensing circuit 30.

The advantages of the described reading method and the memory are evident from the above description. In particular, it is emphasized that they increase the available current dynamics and thus reduce the probability of reading errors without requiring a corresponding increase in the reading voltage. The reading voltage is also kept at a relatively low value thanks to the fact that the threshold voltage of the reference cell with the highest threshold (voltage at which the reference cell begins to conduct current) is set equal to the highest value of the "01" distribution and discrimination is guaranteed by the greater amplification of the cell current with respect to the respective reference currents.

Finally it will be clear that many modifications and variants may be introduced to the method and memory described and illustrated herein, all of which come within the scope of the invention as defined in the accompanying Claims.

What is claimed is:

1. A method for reading a multilevel nonvolatile memory, comprising:

supplying first currents, correlated to a cell current flowing in a memory cell to be read, and second currents, correlated to reference currents, to a plurality of comparison circuits; and comparing each of said first currents with a respective one of said second currents, wherein said step of supplying comprises the steps of amplifying at least one of said cell current and said reference currents by a first amplification factor and amplifying at least one of said cell current and said reference currents by a second amplification factor that differs from the first amplification factor.

2. A method according to claim 1, wherein said amplifying steps include amplifying said cell current by the first and second amplification factors, thereby a first one of said first currents has a different value from a second one of said first currents.

3. A method according to claim 2, wherein at least one of said reference currents is amplified to produce a selected one of the second currents in a same manner as said cell current is amplified to produce a selected one of the first currents, the selected ones of the first and second currents being supplied to a same comparison circuit.

4. A method according to claim 1, wherein said amplification steps include amplifying the cell current by the first amplification factor to produce a first one of the first currents and amplifying one of said reference currents by the second amplification factor to produce a first one of the second currents, the first ones of the first and second currents being supplied to a same comparison circuit.

5. A method according to claim 4, further comprising programming a reference cell at a threshold voltage close to or superimposed on a distribution of program threshold voltages for said memory cell, said reference cell supplying a third current, amplifying said third current by a first quantity to obtain a fourth current, amplifying said cell current by a second quantity to obtain a fifth current and supplying said fourth and fifth currents to a same comparison circuit, wherein said first quantity is less than said second quantity.

6. A multilevel nonvolatile memory, comprising a cell to be read supplying a cell current and a reading circuit for said cell to be read, said reading circuit comprising a plurality of current source circuits and a plurality of comparison circuits, said current source circuits generating first currents, correlated to said cell current, and second currents, correlated to reference currents, and each said comparison circuit receiving one of said first currents and a respective one of said second currents, wherein said current source circuits comprise a plurality of amplifiers and at least one of said amplifiers has an amplification factor different from others of said amplifiers.

7. A memory according to claim 6, wherein said amplifiers comprise cell current amplifiers and reference current amplifiers and one of said cell current amplifiers has an amplification factor different from others of said cell current amplifiers.

8. A memory according to claim 7, wherein one of said cell current amplifiers and one of said reference current amplifiers, connected to a same comparison circuit have equal amplification factors.

9. A memory according to claim 7, wherein a first one of said cell current amplifiers and a first one of said reference current amplifiers, connected to a same comparison circuit, have different amplification factors.

10. A memory according to claim 9, wherein said first cell current amplifier has an amplification factor greater than said first reference current amplifier.

11. A memory according to claim 6, wherein said amplifiers comprise current mirror circuits.

12. A memory according to claim 6, further comprising a plurality of memory cells arranged in a reference array and each connected to a respective one of said current source circuits.

13. A multilevel nonvolatile memory, comprising:

a multilevel memory cell that supplies a cell current;

a first reference cell that supplies a first reference current;

a first current amplifier coupled to the first reference cell and structured to amplify the first reference current to create a first intermediate current; and a first comparator circuit coupled to the memory cell and the first current amplifier and structured to compare the cell current with the first intermediate current, wherein the first comparator circuit includes:

a first current/voltage converter coupled to the memory cell and structured to convert the cell current into a first voltage;

a second current/voltage converter coupled to the first current amplifier and structured to convert the first intermediate current into a second voltage; and a voltage comparator coupled to the first and second current/voltage converters and structured to compare the first and second voltages with each other, wherein the first current/voltage converter includes a first mirror transistor and the second current/voltage converter includes a second mirror transistor that forms a current mirror with the first mirror transistor.

14. The memory of claim 13 wherein the first current amplifier has a first amplification factor and the current mirror has a second amplification factor that is different than the first amplification factor.

15. The memory of claim 13, further comprising:

a second reference cell that supplies a second reference current;

a second current amplifier coupled to the second reference cell and structured to amplify the second reference current to create a second intermediate current; and a second comparator circuit coupled to the memory cell and the second current amplifier and structured to compare the cell current with the second intermediate current.

16. A multilevel nonvolatile memory, comprising:

a multilevel memory cell that supplies a cell current;

a first reference cell that supplies a first reference current;

a first current amplifier coupled to the first reference cell and structured to amplify the first reference current to create a first intermediate current;

a first comparator circuit coupled to the memory cell and the first current amplifier and structured to compare the cell current with the first intermediate current;

a second reference cell that supplies a second reference current;

a second current amplifier coupled to the second reference cell and structured to amplify the second reference current to create a second intermediate current; and a second comparator circuit coupled to the memory cell and the second current amplifier and structured to compare the cell current with the second intermediate current, wherein the first comparator circuit includes:

a first mirror transistor coupled to the memory cell and structured to convert the cell current into a first voltage;

a second mirror transistor coupled to the first current amplifier and forming a first current mirror with the first mirror transistor, the second mirror transistor being structured to convert the first intermediate current into a second voltage;

a first voltage comparator coupled to the first and second mirror transistors and structured to compare the first and second voltages with each other;

a third mirror transistor coupled to the second current amplifier and forming a second current mirror with the first mirror transistor, the third mirror transistor being structured to convert the second intermediate current into a third voltage; and a second voltage comparator coupled to the first and third mirror transistors and structured to compare the first and third voltages with each other.

17. The memory of claim 16 wherein the first current amplifier has a first amplification factor and the current mirror has a second amplification factor that is different than the first amplification factor.

18. The memory of claim 17 wherein the second current amplifier has a third amplification factor that is substantially equal to the first amplification factor.

* * * * *